(12) United States Patent
Thier (10) Patent No.: US 9,491,872 B2
(45) Date of Patent: Nov. 8, 2016

(54) BOX-SHAPED ELECTRICAL SWITCHGEAR CABINET SEALED WITH A COVER FOR A WIND TURBINE

(75) Inventor: Mark-Andre Thier, Ascheberg (DE)

(73) Assignee: SSB Wind Systems GmbH & Co. KG, Salzbergen (DE)

( * ) Notice: Subject to any disclaimer, the term of this patent is extended or adjusted under 35 U.S.C. 154(b) by 384 days.

(21) Appl. No.: 13/817,459

(22) PCT Filed: Jul. 5, 2011

(86) PCT No.: PCT/EP2011/003339
§ 371 (c)(1),
(2), (4) Date: Feb. 18, 2013

(87) PCT Pub. No.: WO2012/022394
PCT Pub. Date: Feb. 23, 2012

(65) Prior Publication Data
US 2013/0155626 A1    Jun. 20, 2013

(30) Foreign Application Priority Data

Aug. 19, 2010   (DE) .................. 10 2010 034 873

(51) Int. Cl.
*H05K 5/00*    (2006.01)

(52) U.S. Cl.
CPC ............ *H05K 5/0017* (2013.01); *F03D 80/82* (2016.05); *H05K 5/0021* (2013.01); *Y02E 10/722* (2013.01)

(58) Field of Classification Search
CPC ............. F16B 5/00; F16B 5/02; F16B 5/10; F16B 12/46; H02B 1/26; H02B 1/20; H02B 1/40; H02B 1/46; H02B 1/32; H02B 1/42; H02B 1/301; H02B 1/308; H02B 1/34; H02B 1/36; H02B 1/48; H01R 9/26; F03D 11/00; H05K 5/00
USPC .......... 340/686.1; 312/326; 211/26; 361/724, 361/600–678
See application file for complete search history.

(56) References Cited

U.S. PATENT DOCUMENTS 2,467,828 A * 4/1949 Hodgkins ................ H02B 1/00
                                                      361/622
2,480,568 A * 8/1949 Garvin ..................... H02B 1/32
                                                      312/100

(Continued)

FOREIGN PATENT DOCUMENTS

DE    196 39 889 A1    4/1998
DE    298 18 507 U1    1/1999

(Continued)

OTHER PUBLICATIONS

English translation of French publication FR 2300442, dated Sep. 3, 1976, No date for translation.*

(Continued)

*Primary Examiner* — Anthony Haughton
*Assistant Examiner* — Matt Dhillon
(74) *Attorney, Agent, or Firm* — Harness, Dickey & Pierce, P.L.C.

(57) ABSTRACT

A box-shaped electric control cabinet is provided which can be closed by a cover and which is used to receive electric components and devices for a blade angle adjustment drive (pitch drive) of a wind energy power plant, by means of which one or more rotor blades of the plant can be rotated about the blade axis. The control cabinet includes at least two cabinet segments, and specific electric components and devices are associated with respectively each module according to its function. The cabinet segments can be associated with and/or assigned to respectively different electric components and devices, with which, combined as a part function, different total functions and/or embodiment forms of the control cabinet can be produced or are producible.

22 Claims, 3 Drawing Sheets

(56) References Cited

U.S. PATENT DOCUMENTS

| | | | | |
|---|---|---|---|---|
| 2,542,853 A * | 2/1951 | Wills | H02B 1/21 | 361/608 |
| 2,645,743 A * | 7/1953 | De Smidt | H02B 1/21 | 200/293 |
| 2,719,251 A * | 9/1955 | Stewart | H02B 1/36 | 174/535 |
| 2,927,249 A * | 3/1960 | Jones | H02B 1/36 | 16/258 |
| 2,997,627 A * | 8/1961 | Ellegood | H02B 1/21 | 174/88 B |
| 2,997,629 A * | 8/1961 | Wolski | H02B 1/34 | 312/296 |
| 3,495,135 A * | 2/1970 | Paape | H02B 1/30 | 361/608 |
| 3,840,785 A * | 10/1974 | Olashaw | H02B 1/21 | 174/174 |
| 4,178,624 A * | 12/1979 | Wilson | H02B 11/173 | 361/611 |
| 4,305,114 A * | 12/1981 | Takagi | H02B 3/00 | 361/609 |
| 4,528,614 A * | 7/1985 | Shariff | H02B 1/36 | 165/104.33 |
| 5,166,887 A * | 11/1992 | Farrington | H02H 3/00 | 361/94 |
| 5,305,187 A * | 4/1994 | Umezu | H05K 7/1425 | 257/686 |
| 5,761,797 A * | 6/1998 | Besserer | H02B 1/01 | 29/825 |
| 6,215,654 B1 * | 4/2001 | Wilkie, II | H02B 1/21 | 218/156 |
| 6,269,000 B1 * | 7/2001 | McCarrol | | 361/695 |
| 6,324,063 B1 * | 11/2001 | Mohler | H01R 9/2658 | 361/728 |
| 6,366,448 B1 * | 4/2002 | Berndt | H02B 1/32 | 200/50.21 |
| 6,777,627 B1 * | 8/2004 | Stevenson | H02B 3/00 | 200/50.21 |
| 6,791,027 B1 * | 9/2004 | Nicolai | H02B 1/306 | 174/17 R |
| 6,999,305 B1 * | 2/2006 | Calcote | | 361/601 |
| 7,450,369 B2 * | 11/2008 | Wilkie, II | H02B 1/42 | 200/50.28 |
| 7,492,062 B1 * | 2/2009 | Wristen | H01H 33/593 | 307/113 |
| 7,586,037 B2 * | 9/2009 | Parker | H05K 7/18 | 174/17 R |
| 7,735,939 B2 * | 6/2010 | Parshad et al. | | 312/108 |
| 7,808,775 B2 * | 10/2010 | Cherney | H05K 7/1432 | 174/70 B |
| 7,826,201 B2 * | 11/2010 | Schell | H02B 1/21 | 361/608 |
| 7,839,623 B2 * | 11/2010 | Coffey | H02B 1/04 | 174/59 |
| 7,859,838 B2 * | 12/2010 | Pesonen | H02M 7/003 | 361/690 |
| 8,189,325 B2 * | 5/2012 | Kurogi | H02B 13/01 | 218/157 |
| 8,240,785 B2 * | 8/2012 | Schell | H02B 1/36 | 312/223.6 |
| 8,405,237 B2 * | 3/2013 | Warfen | F03D 7/0224 | 290/44 |
| 8,680,407 B1 * | 3/2014 | Chan | | 174/560 |
| 2002/0089815 A1 * | 7/2002 | Behr et al. | | 361/605 |
| 2004/0100757 A1 * | 5/2004 | Hegmann | H02B 13/02 | 361/605 |
| 2004/0240160 A1 * | 12/2004 | Mahn | H02B 13/025 | 361/676 |
| 2006/0067018 A1 * | 3/2006 | Malkowski | H02B 11/04 | 361/2 |
| 2006/0120001 A1 * | 6/2006 | Weber | H02M 7/003 | 361/103 |
| 2006/0120027 A1 * | 6/2006 | Josten | H02B 1/14 | 361/624 |
| 2006/0158037 A1 * | 7/2006 | Danley | H02J 3/32 | 307/64 |
| 2006/0245169 A1 * | 11/2006 | Freimuth | H01R 9/2616 | 361/729 |
| 2007/0081302 A1 * | 4/2007 | Nicolai | H05K 7/20754 | 361/678 |
| 2008/0062620 A1 * | 3/2008 | Parker | H02B 1/21 | 361/605 |
| 2009/0001726 A1 * | 1/2009 | Warfen et al. | | 290/44 |
| 2009/0273915 A1 * | 11/2009 | Dean et al. | | 361/826 |
| 2009/0289020 A1 * | 11/2009 | Wurmhoringer | H02B 1/01 | 211/85.17 |
| 2010/0027196 A1 * | 2/2010 | Schell et al. | | 361/611 |
| 2012/0170175 A1 * | 7/2012 | Silberbauer et al. | | 361/637 |
| 2012/0177492 A1 | 7/2012 | Schomakers et al. | | |

FOREIGN PATENT DOCUMENTS

| | | |
|---|---|---|
| DE | 197 43 974 A1 | 4/1999 |
| DE | 102 41 574 A1 | 3/2004 |
| DE | 10 2006 009127 A1 | 9/2007 |
| DE | 10 2009 044 036 A1 | 4/2011 |
| EP | 0 810 701 A1 | 12/1997 |
| FR | 2 300 442 | 9/1976 |
| WO | WO-2011/032897 A2 | 3/2011 |

OTHER PUBLICATIONS

International Search Report (in German with English translation) and Written Opinion (in German) for PCT/EP2011/003339, mailed Mar. 20, 2012; ISA/EP.

* cited by examiner

BOX-SHAPED ELECTRICAL SWITCHGEAR CABINET SEALED WITH A COVER FOR A WIND TURBINE

CROSS-REFERENCE TO RELATED APPLICATIONS

This application is a 371 U.S. National Stage of International Application No. PCT/EP2011/003339, filed Jul. 5, 2011, and claims priority to German Patent Application No. 10 2010 034 873.2 filed Aug. 19, 2010, the disclosures of which are herein incorporated by reference in their entirety.

FIELD

The invention relates to a box-shaped electrical switchgear cabinet sealed with a cover of a wind turbine In particular, the invention relates to the geometric arrangement and exchangeability of switchgear cabinet segments. The invention also relates to a wind turbine with a box-shaped electrical switchgear cabinet sealed with a cover.

BACKGROUND

Modern wind turbines have rotor blades rotatably mounted on a rotor, it being possible to vary an angle of incidence of the wind through an individual change of the blade angle relative for each rotor blade. The change takes place through a pitch drive which is connected to an external mains supply and has a controllable electric motor, to which, as well as to a converter, control and regulating devices are assigned for adjusting the rotor blade, which are arranged in an electrical switchgear cabinet (pitch switchgear cabinet). Essential components of a pitch switchgear cabinet are electronic converter units for the controlled drive of the pitch system. Such a cabinet is thus also designated as a converter box. A converter box has e.g. electrical or electronic components and equipment such as e.g. mains adapters, circuit breakers and plugs, input/output units, fuses, transformers and other parts and equipment, which are also provided in a classic switchgear cabinet for an electrical drive.

An individual pitch drive with an associated control cabinet is usually assigned to each blade (axis), so that a plurality of pitch switchgear cabinets are provided in a wind turbine (WEA) which are usually arranged on the upper masthead (top box) of the turbine and configured as a compact box sealed with a cover. They are arranged there either in the rotating part (hub) and/or in the fixed part of the turbine (gondola), being preferably arranged, however, close to the support of the rotor blade in the hub. If the control of the pitch system runs in a coordinated manner for a plurality of axes, what is known as a master control cabinet (control box) can additionally be provided in the hub or also in the gondola, which is interconnected to the associated axis boxes.

Due to the installation site and the mounting location, these boxes are exposed to particularly extreme weather conditions.

In the event of power interruptions or power failure it must be ensured that the voltage supply of the pitch drive is maintained at least for a short time. Each pitch drive therefore also has additional direct voltage sources arranged in the rotor or in the gondola in the form of accumulators or rechargeable capacitors, which are directly connected to the respective drive unit (converter+motor). This voltage source ensures that in the event of failure of the mains supply, the energy supply of the pitch drive is maintained at least for a certain time. Through an actuation of the motor, the respective rotor blade is brought into what is known as the feathering position or parking position and the turbine thus shuts down or operates further only with secure rotary speed (Fail Safe Function). Due to the mounting location, the rechargeable direct voltage sources with the associated switches are also enclosed in a box-shaped cabinet (accumulator box), which is usually arranged close to the associated axis box.

Converter box and accumulator box thus form a switchgear cabinet combination of two or a plurality of cabinets or boxes which are directly connected to each other or are adjacently arranged.

A wind turbine with three rotor blades can have up to 7 switchgear cabinets which are constructed differently according to requirements and function and must each be made individually. The different switchgear cabinets are today also constructed in a modular manner to an extent, i.e. the individual components are assembled according to their function and each form either an individual module or segment or the arrangement has a plurality of module housings which are mechanically and electrically connected to each other.

A DE patent application of the applicant not yet published on the priority date having the publication number DE 10 2009 044 034 A1 shows a wind turbine with an electrical switchgear cabinet arrangement in which a circuit for actuating at least one blade adjustment drive (pitch system) is provided by means of which one or a plurality of rotor blades of the wind turbine can be rotated about their blade axes. The switchgear cabinet arrangement has a plurality of modules which are assembled in one compact and radially central container, the inner space of which is divided into a plurality of segments (modules) in particular by partitions. The partitions form a switchgear cabinet or module with the wall of a segment, to which switchgear cabinet or module a certain function is assigned.

Thus a module is provided for the function of the accumulator cabinet, another module for the function of the converter cabinet, a further module for the function of the control cabinet and optionally further modules for other functions. The individual modules can each form a separate structural unit which can also be made separately. However, the above-mentioned special electrical function is assigned to each module or honeycomb. Interchangeability between the functions is not provided for with the individual modules.

Switchgear cabinets constructed in a modular manner are known from the general switchgear cabinet structure (e.g. DE 102 41 574 B4) which have a plurality of module housings and are connected to each other via a connection element. The module housings can each have a series of electrical plug connections which are either led outwardly or are provided for connecting the module housings.

A switchgear cabinet with a switchgear cabinet box having a plurality of modules fixed to a support rail is known from DE 197 43 974 A1, a certain function being assigned to each individual module. The switchgear cabinet is only function-block orientated and modularly constructed. The modules do not differ in their technical function from a classic switchgear cabinet, rather only in their simpler mode of installation and/or upgrading.

The substantial disadvantage of the known solutions is that with an increasing number of electrical components, caused by technical changes to the wind turbine, the layout of the switchgear cabinet must be enlarged. A further cabinet or a module must be added to the existing switchgear cabinet arrangement if necessary. If a higher level of equipping is required, e.g. if the additional or larger components are required, a new cabinet is designed or an additional housing module is added to the existing arrangement.

With identical parts or identical functions of switchgear cabinets, the turbine operator therefore always has to design and make new switchgear cabinets with the corresponding content for altered technical requirements, which switchgear cabinets have be produced individually, held in stock and have to each be fitted. This makes switchgear cabinet production expensive and laborious.

Since there is limited space available in the current hubs of wind turbines, the optimal balance between necessary space for electrical components and the size of the hub has to be established. It is not unusual that axis cabinets in particular cannot once again be removed following installation in the hub without the blades of the WEA having to be dismounted. In the small space conditions in the hub, this involves significant effort or is usually not possible. In the case of a complete failure of a pitch system, the hub, including the blades, usually has to be removed from the gondola. The blades are then dismounted on the ground in order to remove the axis switchgear cabinets through the blade bearing openings and to optionally install new switchgear cabinets or modules.

SUMMARY

An object of the invention is to flexibly design and to improve the production and fitting of switchgear cabinets according to technical requirements. It is also intended to improve the installation and the dismounting of such switchgear cabinets.

The object of the invention is achieved in connection with the preamble of claim 1 through its characterising features. Advantageous developments of the inventive solution result from the subclaims.

The invention is based on a modular system, with which different switchgear cabinets or switchgear cabinet arrangements can be implemented according to requirement and function. The modular system in this connection is designed such that different functions can be implemented with few modular components and with switchgear cabinet segments or modules. The individual modular components can thus be produced in higher quantities and optionally as series production using automatic machines and even held in stock. This leads to lower production costs. With few modular components, different cabinets with different functions can thus be produced cost-effectively and flexibly. The functions can be shown for a corresponding arrangement of the modular components.

The overall function of a switchgear cabinet comprises on the one hand certain basic functions which recur over and over and to which a basic modular component in the form of a basic module is assigned. Further auxiliary functions, which operate subsequently or conjunctively, and to which an auxiliary modular component is thus assigned as an auxiliary module. As a further subfunction of the overall function, special functions are provided which are particularly supplementary and enhancing and to which a special modular component or special module is thus assigned. The overall function further comprises adapting functions which cannot exactly be fixed in all parts and to which an adapting modular component or an adapting module is assigned.

The modular system can be additionally supplemented by what is known as a mixing system which includes request-specific functions, which are not foreseeable and to which what is known as a "non modular component" or a non module is assignable.

Different variants of the overall function of a switchgear cabinet can thus be assigned to certain modular components or switchgear cabinet segments, which used flexibly, result in different switchgear cabinets. The different modular components or modules can be pre-made according to their function mentioned above, optionally held in stock and flexibly assembled to form a switchgear cabinet with a different function.

From the prior art, it was hitherto only known to assign a certain functional modular component to an individual module and not—as proposed in the invention—to be able to use the one and the same module or segment for different functions.

Through the flexible, modular structure of the switchgear cabinet, the individual segments or modules can be mounted or later subsequently dismounted at difficult to access points e.g. above in the wind turbine, without requiring great effort to more easily assemble a switchgear cabinet in the hub or in the nacelle, since the individual segments have smaller dimensions than a complete switchgear cabinet. This in turn brings about, in addition to the lower production costs and maintenance costs, greater availability of the turbine.

Preferably the segments and modules of the switchgear cabinet consist of metal, in particular stainless steel, of coated steel or of another material, such as for example plastics, which is suitable for use in wind turbines.

In an advantageous embodiment, a plurality of different segments or modules is arranged successively or adjacently. Successively arranged, they form a compact, box-shaped switchgear cabinet which is open from above. Transverse thereto further box-shaped switchgear cabinets, with a different function however, can be presented by a combination of identical segments or modules. The switchgear cabinets or switchgear cabinet arrangements resulting from such a combination can in this connection either be arranged directly adjacently or at a distance from each other.

Each segment and module advantageously has an individual cover, a common covering of all segments or modules also of course being possible. The individual or common cover is made from the same material or another suitable material as the individual modules or segments.

Within the framework of the modular system, it is advantageous to reduce the number of segments or modules to a minimum. For the provided function of the switchgear cabinet, only three different modules or segments are required for the pitch drive, an end cap module, an outer segment and a central segment. The segments or modules in one first embodiment of the invention are thus assignable to the spatial arrangement in the switchgear cabinet.

For example an end cap as mounting plate for the installation of electrical components and equipment of the switchgear cabinet and the supports thereof can be provided in the switchgear cabinet constructed in a segmented or modular manner. A further end cap opposite the first end cap could be provided as a plug panel for the electrical connection outwards or to another adjacent switchgear cabinet or switchgear cabinet module. In this connection, the end cap of the plug panel can comprise surface stamps for the arrangement of plugs or plug panels on its surface. If small or only very few stamps are required, this end cap is constructed virtually identically as its mounting plate opposite and can accordingly also be used as such.

The requirement of the modular system with as few as possible identical modular components to implement various functions of the switchgear cabinet, is further advantageously realised in that the two outer segments and the central segment enclosed by the two outer segments comprises a virtually identical structure in their basic structure. This has the advantage that one and the same segment can be used either as the outer segment or as the central segment. In a further embodiment of the invention, the spatial assignment of the segments or modules is thus removed.

A segment or module consists of a U-shaped, planar frame construction with a rectangular closed or open base surface extending horizontally, which is surrounded by frame parts and has planar frame lateral parts protruding laterally and perpendicularly. The central segment is connected in each case to a longitudinal frame part and a lateral frame part with the corresponding frame parts of an outer segment.

According to their function and the use, the U-shaped segment parts (outer segment and/or central segment) are configured with different widths.

The two outer segments and the central segment are further distinguished in that they each have partly open and/or closed base or lateral surfaces, according to the function for which they are used. Both segments or modules are thus in principle interchangeable and can be produced as a single element which only needs to be adapted according to its use by stampable openings in the lateral surfaces or in the base surface.

In order to implement the closed box shape of the switchgear cabinet, the surface of the outer segment pointing outwards is covered between the two frame lateral parts by an end cap in each case. The lateral frame parts of the central segment can form a closed surface on both sides or have openings in its closed base surface. In the lateral walls of the outer segment open surfaces can be produced e.g. subsequently by stamps. Switches or connection parts or other electrical components can be fixed outwardly in the stamped openings in one of the lateral walls of the outer segment.

With the modular system, a switchgear cabinet arrangement, which has a plurality of individual switchgear cabinets, can also advantageously be implemented with the two segments or modules described above as the modular component.

A converter cabinet (converter box) can on the one hand be produced with the two segments, in which converter cabinet all equipment and devices for the conversion of power are arranged, as they are provided in a classic switchgear cabinet. This cabinet is producible separately as a partial cabinet and can thus be combined separately in different ways, above in the hub or in the gondola of the wind turbine with other cabinets by means of screws, bolts or rivets and then later dismounted.

A container can, however, also be produced with virtually the same elements as the converter box which only has rechargeable voltage sources in the form of accumulators or capacitors with their associated switches which ensure an emergency power supply in the event of a failure of the power supply of the pitch drive, in order to immediately rotate the rotor blades to a parking or feathering position. For safety reasons (degassing) such an "accumulator box" is provided separately from that of the converter box.

In a further embodiment, both boxes—and any further additional boxes, if necessary—are thus constructed in principle from only one identical part, a U-shaped segment part which is either usable as the outer segment or the central segment.

Further types of embodiment and variations of the invention emerge from the subclaims and the exemplary embodiments shown below in the drawing.

BRIEF DESCRIPTION OF DRAWINGS

The drawings described herein are for illustrative purposes only of selected embodiments and not all possible implementations, and are not intended to limit the scope of the present disclosure.

DETAILED DESCRIPTION

Example embodiments will now be described more fully with reference to the accompanying drawings.

Figure 1:
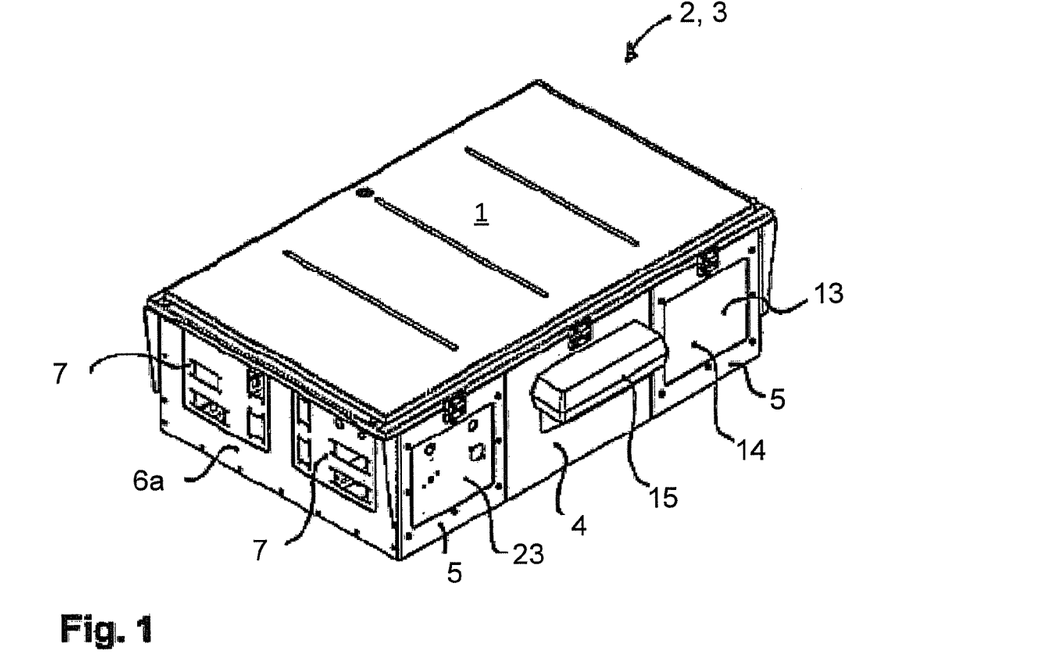
FIG. 1 shows a perspective representation of a first embodiment of the invention.

FIG. 1 shows an electrical switchgear cabinet 2 configured in a box-shape and closed with a cover 1, in which electrical equipment and switches (not shown) are arranged for controlling a blade angle adjustment drive (pitch drive) of a wind turbine (WEA) by means of which one or a plurality of rotor blades of the turbine are rotatably adjustable about their blade axes. Essential components of such a switchgear cabinet are the electronic converter units for the controlled drive of the pitch system. These cabinets are therefore also designated as converter box 3. The converter box 3 comprises e.g. electrical or electronic elements and equipment such as e.g. mains adapters, circuit breakers and plugs, input/output units, fuses, transformers and other parts and equipment, which are also provided in a classic switchgear cabinet for an electrical drive.

The converter box 3, functioning as an electrical switchgear cabinet, is assembled from three modules or segments of a modular system 21 which are arranged successively. The modules or segments thus form modular components 22 of the modular system 21. The structure of such a modular system 21 with individual modular components 22 can be seen in FIG. 5.

Figure 2:
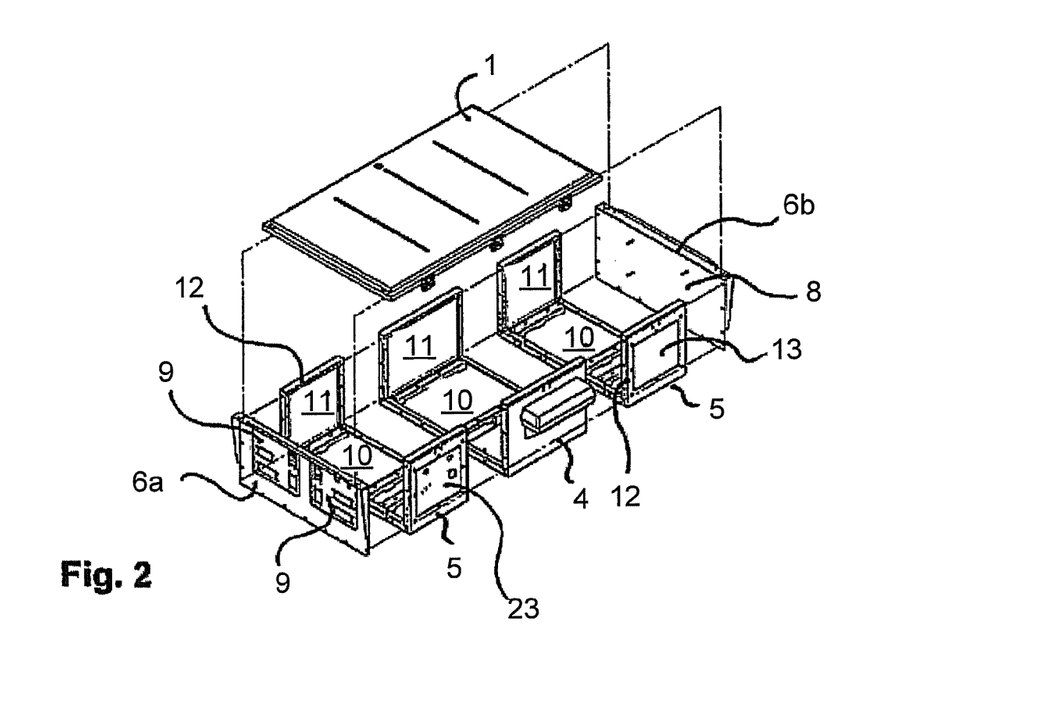
FIG. 2 shows FIG. 1 in an exploded representation.
Figure 5:
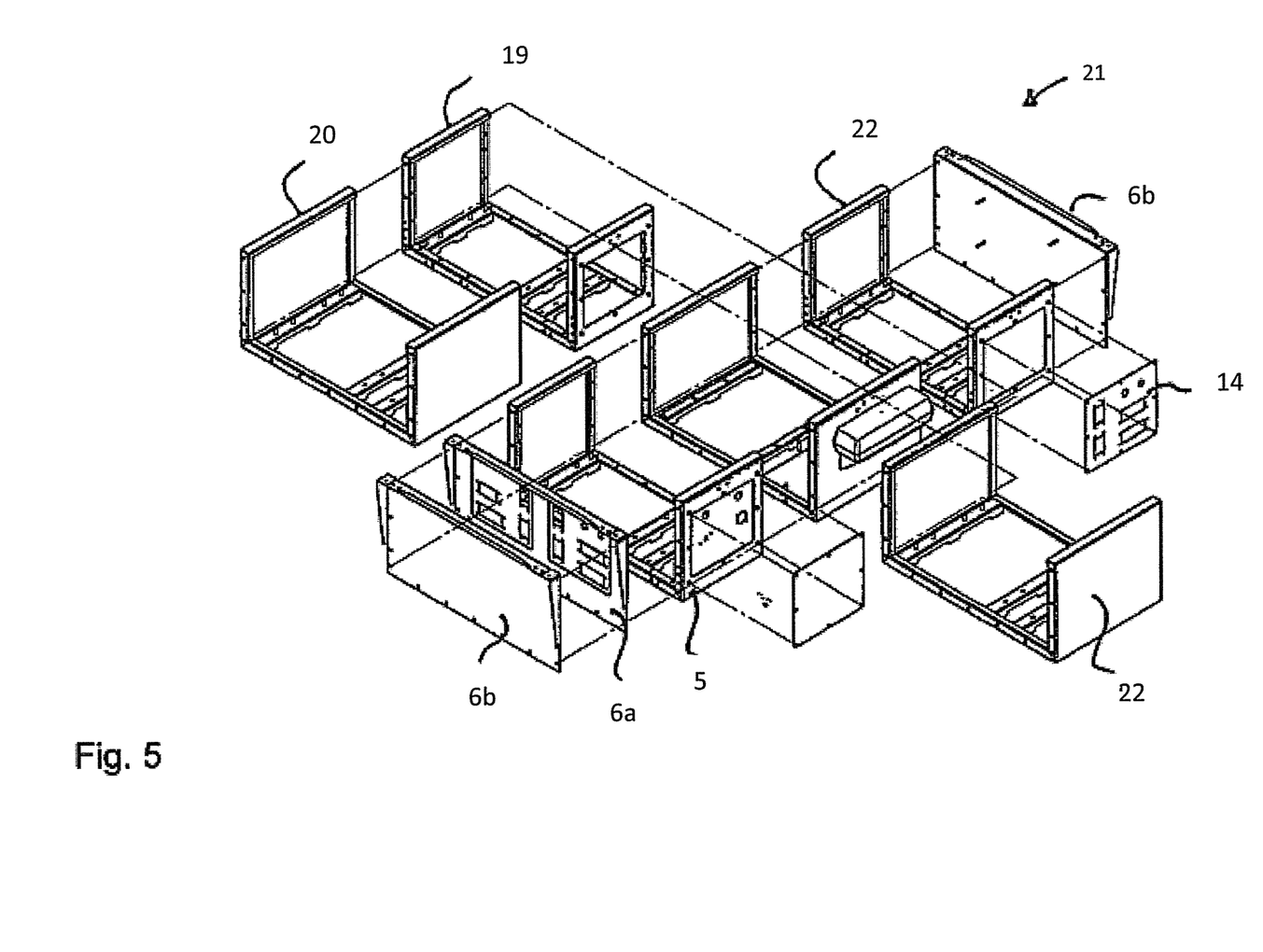
FIG. 5 shows a schematic representation of a modular system with assignable modular components for the production of a modular switchgear cabinet.

By means of the modular system 21 shown in FIG. 5, the converter box 3 has been assembled in FIG. 1 and in FIG. 2. In the centre of the converter box 3—as can be seen in particular in FIG. 2—a U-shaped central segment 4 is arranged, which is connected at its lateral edge, both right and left, in each case with a likewise U-shaped outer segment 5. Both outer segments 5 and the central segment 4 are tightly, but separably, connected along their longitudinal side via corresponding connection means. The two outer segments 5 and the central segment 4 enclosing them are constructed substantially identically, as can also be seen in FIG. 2. They are distinguished in the embodiment as converter box 3 only in their lateral length. The two outer segments 5 are shorter than the central segment 4 in the embodiment according to FIG. 1 and FIG. 2. However, they can also have the same lateral length as the central segment 4.

FIG. 2 shows an exploded representation of the modular structure of the converter box 3. The two outer segments 5 are covered on their longitudinal side directed outwards by an end cap 6a, 6b in each case which thus close the box in the longitudinal direction. The two end caps are also constructed virtually identically. Each cap 6a, 6b comprises a plate, the surfaces of which are stampable according to requirements so that they form open or closed surfaces.

With the end cap 6a shown in the front region of FIGS. 1 and 2, the surfaces are stamped in the manner of two adjacent windows 9 (FIG. 1). Each window 9 has a plug panel 7 (FIG. 1), in which plugs are arranged for connection of the power supply or for communication with the pitch drive or with a superordinate controller of the WEA. The rear end cap 6b is provided as a mounting plate 8 for installing equipment or switches. Alternatively, the non-stamped front end cap 6a could also be used for this cap.

The U-shaped central segment 4 and the two outer segments 5 in each case consist of a base surface 10 and perpendicular thereto lateral surfaces 11 protruding laterally. The base surface 10 and the two lateral surfaces 11 are delimited by frame parts 12 which are connected to each other and to the adjacent frame (see FIG. 1). In the embodiment of the switchgear cabinet 2 as an accumulator box 3, all base surfaces 10 are closed. However, the lateral surfaces 11 have a different surface design. The two rear lateral surfaces 11 of the two outer segments 5 are closed, while their front lateral surfaces 11 have an opening 13 over their entire surface, which is, however, sealed with a stampable plate 14 (FIG. 1). On the plate 14 of the front outer segment 5, a switch panel 23 is provided for mounting switches and similar devices. In the case of the front plate 14 (FIG. 1) of the rear outer segment 5, the plate 14 is, however, not stamped. The two lateral surfaces 11 of the central segment 4 form, at front and rear, a closed surface. A lighting device 15 (FIG. 1) for the hub of the wind turbine is additionally arranged on the front lateral surface 11.

Figure 3:
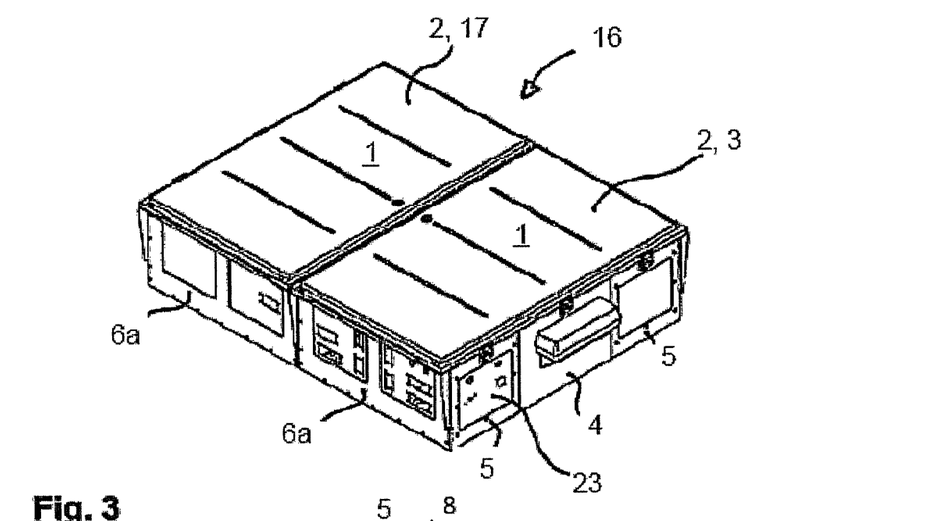
FIG. 3 shows a perspective representation of a further embodiment of the invention.

FIG. 3 shows a switchgear cabinet arrangement 16 assembled from individual modules 4 and 5. The switchgear cabinet 16 consists of a combination of two successively arranged switchgear cabinets 2, which are in each case covered by a cover 1.

During the further course of the description, identical elements or functions are provided with the same reference numerals.

The switchgear cabinet 16 is produced with the modular system 21 according to FIG. 5, with an additional switchgear cabinet 2, which is constructed from virtually the same modular components 22, i.e. segments and modules (4, 5) as the converter box 3 from FIG. 1 and FIG. 2 described above. The further switchgear cabinet 2 is arranged laterally (in FIG. 3 and FIG. 4 to the left) on the converter box 3. The switchgear cabinet 2, according to the modular system 21 from FIG. 5, is assembled from virtually the same segments or modules as the converter box 3.

Figure 4:
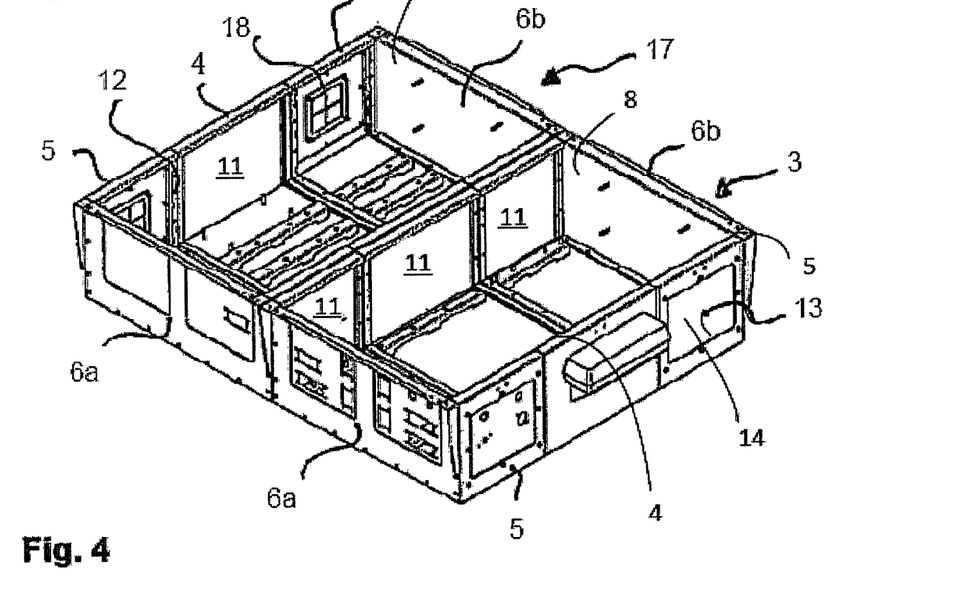
FIG. 4 shows FIG. 3 as an open switchgear cabinet combination.

FIG. 4 shows the switchgear cabinet 16 from FIG. 3 without the covers 1, and without contents, so that the modular structure of both cabinets can be seen.

The second switchgear cabinet 2 is what is known as an accumulator box 17, a container, in which rechargeable direct voltage sources in the form of accumulators (thus the designation accumulator box) or rechargeable capacitors and the interconnections thereof are arranged. For safety reasons, the accumulators must be arranged in a separate container, the accumulator box 17. The accumulators arranged in the accumulator box 17 (or other rechargeable voltage sources) have the object of ensuring the power supply to the associated pitch drive for a short time in the event of power interruptions or a power failure.

In FIG. 4, modular structure of the accumulator box 17 is seen to be virtually identical to that of the adjacent converter box 3. It can be seen from FIG. 4 that the accumulator box 17 consists of a central segment 4 to which outer segments 5 are laterally, assigned. On both outer surfaces of the outer segment 5, as with the converter box 3, end caps 6a and 6b are also provided. The front cover plate 6a analogue to the converter box 3 can be seen to also have two stampable window openings. The window openings, however, in contrast to the two window openings 9 in the converter box 2 are sealed with the exception of a single small plug opening for the connection to the converter box 3 in the left window. The rear end cap 6b, as its counterpart in the converter box 3, has a continuous, closed mounting plate 8.

As with the converter box 3, the two outer segments 5 and the central segment 4 of the accumulator box 17 consist of a U-shaped frame construction, the structure of which was already described. The lateral surface 11 of the outer segment 5 directed forwards, as with the converter box 3, also has an opening 13, which is, however, sealed by a plate 14. The rear lateral surface 11 of the two outer segments 5 has a further opening 18 for the air conditioning of the accumulator cabinet 17. The central segment 4 of the accumulator cabinet is identical to that of the converter box 3.

For the production of both the accumulator box 17 as well as the converter box 3, only one U-shaped segment part, and in each case end caps 6a and 6b and a cover 1, are required. With these two modular components 20, different switchgear cabinet arrangements can thus be implemented. If for example a larger converter is required for another application, a larger central segment is used.

For the construction of the switchgear cabinets, shorter delivery times thus result due to identical parts frequently being present.

FIG. 5 shows a schematic representation of the modular system 21 already described above with assignable modular components 22 for the production of a modular switchgear cabinet. With the few modules and segments shown in FIG. 5, different switchgear cabinets or switchgear cabinet arrangements can be implemented as required and according to function. The functions can form a corresponding arrangement of the modular components.

A narrow U-shaped segment or module 19 and a wide U-shaped segment or module 20 are shown in the top left of FIG. 5 as first basic modular components. The shorter segment 20 is identical in its basic structure to the outer segment 5 in the application as accumulator box 17 or as converter box 3, and the wider segment 20 is identical to the central segment 4. The lateral surfaces of the basic modular component are configured as an auxiliary element, a special element, an adapting element or as a non modular component, like for example the plug panel 7, the window openings 9 and 13, or the plate 14. As can further be seen from FIG. 5, the spatial arrangement of the two basic modular components 19 and 20 can also be interchanged, i.e. the modular component designated as central segment 4 in the accumulator box can also be arranged at the edge. Furthermore, a modular component designated as outer segment in the converter box can take up a central position.

The two end caps 6a and 6b can also be seen from FIG. 5 as a further basic modular component. Each cap consists of a plate which is in each case, as required and according to function, also configured as auxiliary element, special element, adapting element or as non modular component.

A switchgear cabinet 2, which functions as a master control cabinet or master control box in the hub or in the gondola, can be assembled from a combination of two short U-shaped segments or two basic modular components 19 according to FIG. 5. The latter in turn correspond to two outer segments 5 of a converter box 3. By virtue of a modular arrangement with only few partial segments or modules, different customer specifications can thus be presented with one and the same modular system.

The invention claimed is:

1. A box-shaped electrical switchgear cabinet sealed with a cover for accommodating electrical components and equipment for a blade angle adjustment drive (pitch drive) of a wind turbine, by means of which one or a plurality of rotor blades of the turbine are rotatable about their blade axes, the switchgear cabinet being assembled from at least two modules or switchgear cabinet segments and certain electrical components and equipment being functionally assigned to one module in each case, the switchgear cabinet comprising:

different electrical components and equipment which are in each case assigned or are assignable to a segment or module, with said electrical components and equipment—combined as a subfunction—different overall functions or embodiments of the switchgear cabinet are implemented or are implementable, wherein the modules or segments form modular segments of a modular system, each said modular segment having frame parts enabling modular coupling to an adjacently positioned one of the modular segments, to thus form the modular system;

wherein the modules or segments form U-shaped frame segments, the U-shaped frame segments each including a planar base surface and two planar lateral surfaces projecting generally perpendicularly from the base surface, the lateral surfaces being of dimensions to enable the electrical components to be housed fully within the modules using only a cover attached to the lateral surfaces, and at least a pair of end caps secured to edge portions of the U-shaped frame segments, to form a fully enclosed cabinet assembly;

wherein the switchgear cabinet is modularly expandable along two perpendicular axes, and a selected one or more of the lateral surfaces, and one or both of the pair of plates having openings to enable cabling interconnecting electrical components to pass through, and wherein said openings are able to be selectively sealed, when not needed, by separate plates fastened to the wall portions; and wherein one of the modular segments is used to form a converter box, in which the equipment and devices for one or a plurality of converter units for the pitch drive can be arranged, by means of which one or a plurality of blades of the turbine can be rotatably adjusted about their blade axes, and wherein a different one of the modular segments is used to form an accumulator box in which rechargeable direct voltage sources in the form of accumulators or rechargeable capacitors and the interconnections thereof can be arranged, by means of which direct voltage the power supply to the associated pitch drive can be ensured for a short time in the event of power interruptions or a power failure, so that the switchgear cabinet can be used both in its function as a converter box and in its function as an accumulator box.

2. The switchgear cabinet according to claim 1, wherein each of the first and second cabinet segments or modules is comprised of metal, preferably of stainless steel, powder-coated steel, plastics or another suitable material.

3. The switchgear cabinet according to claim 1, wherein a plurality of different ones of the cabinet segments or modules are arranged laterally to form a box-shaped switchgear cabinet and transverse thereto such that the same cabinet segments or modules form a further box-shaped switchgear cabinet with different functions.

4. The switchgear cabinet according claim 1, wherein each said cabinet segment or module has an individual cover.

5. The switchgear cabinet according to claim 1, wherein three different ones of the cabinet segments or modules adjacently arranged are covered by the common cover and form the switchgear cabinet.

6. The switchgear cabinet according to claim 1, wherein the cabinet segments or modules are assignable to a spatial position inside the switchgear cabinet.

7. The switchgear cabinet according to claim 1, wherein the cabinet segments or modules are arranged independent of their spatial position inside the switchgear cabinet.

8. The switchgear cabinet according to claim 1, wherein at least one of the cabinet segments or modules has a first one of the pair of end caps and a second one of the end caps, a first outer segment and a second outer segment, and one or a plurality of central segments of the switchgear cabinet.

9. The switchgear cabinet according to claim 8, wherein the two end caps are approximately equal in surface area, the first end cap having a mounting plate for attaching electrical components and equipment of the switchgear cabinet and supports thereof, and the second end cap having a plate with a plug panel.

10. The switchgear cabinet according to claim 8, wherein the first end cap has surface stamps on its surface for the arrangement of plugs or plug panels or other electrical components.

11. The switchgear cabinet according to claim 8, wherein the outer segment and the central segment have substantially the same structure and are interchangeable among each other.

12. The switchgear cabinet according to claim 8, wherein the central segment and at least one of the first and second outer segments have different widths.

13. The switchgear cabinet according to claim 12, wherein each one of the first and second outer segments and the central segment have the U-shaped frame construction with the planar base surface extending horizontally, which is surrounded by the frame parts, and which has a pair of the planar lateral surfaces protruding laterally and perpendicularly of the rectangular base surface.

14. The switchgear cabinet according to claim 13, wherein at least one of the planar base and the planar lateral surfaces of at least one of the first and second generally U-shaped cabinet segments or modules has open surfaces or stampable openings according to requirements and function.

15. The switchgear cabinet according to claim 13, wherein a frame lateral surface of the cabinet segment or module has an opening, which is sealed by a stampable plate, and the opposite surface of which has a closed surface.

16. The switchgear according to claim 15, wherein electrical switches directed outwards are arranged on the stampable plate.

17. The switchgear cabinet according to claim 8, wherein the surface of at least one of the first and second outer cabinet segments pointing outwards is covered on each of its longitudinal sides by the end caps.

18. The switchgear cabinet according to claim 8, wherein the central cabinet segment in each case has a longitudinally arranged one of the frame parts and a laterally arranged one of the frame parts connected with the corresponding frame parts of one of the outer cabinet segments.

19. The switchgear cabinet according to claim 18, wherein the lateral frame part of the central cabinet segment forms closed surfaces on both sides.

20. The switchgear cabinet according to claim 19, wherein the central cabinet segment and at least one of the first and second outer segments have openings on their closed base surface.

21. The switchgear cabinet according to claim 1, wherein the converter box and the accumulator box each have a central segment and laterally arranged outer segments, an outwardly directed lateral surface of which is in each case covered by end caps.

22. The switchgear cabinet according to claim 21, wherein both of said converter box and said accumulator box have a plurality of U-shaped segment parts which are provided either as an outer segment with the end caps, or are usable as the central segment.

* * * * *